(12) United States Patent
Schrock

(10) Patent No.: US 11,222,868 B2
(45) Date of Patent: Jan. 11, 2022

(54) THERMAL TRANSFER STRUCTURES FOR SEMICONDUCTOR DIE ASSEMBLIES

(71) Applicant: Micron Technology, Inc., Boise, ID (US)

(72) Inventor: Ed A. Schrock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/203,692

(22) Filed: Jul. 6, 2016

(65) Prior Publication Data

US 2018/0012865 A1   Jan. 11, 2018

(51) Int. Cl.
*H01L 25/065* (2006.01)
*H01L 23/367* (2006.01)
(Continued)

(52) U.S. Cl.
CPC ...... *H01L 25/0657* (2013.01); *H01L 21/4803* (2013.01); *H01L 21/4817* (2013.01);
(Continued)

(58) Field of Classification Search
CPC ............ H01L 21/4803; H01L 21/4817; H01L 21/563; H01L 21/565; H01L 25/0657; H01L 23/053; H01L 23/08; H01L 23/10; H01L 23/24; H01L 23/3142; H01L 23/367; H01L 23/3675; H01L 23/4334; H01L 2225/06589; H01L 2225/06513; H01L 2225/06517; H01L 2225/06555; H01L 2924/19041; H01L 2924/19105; H01L 2924/1436; H01L 2924/1437; H01L 2924/1616; H01L 2924/173; H01L 2924/1717; H01L 2924/16235; H01L 2924/16251; H01L 2924/16227; H01L 2924/1329; H01L 2924/29393; H01L 2924/16195; H01L 2224/81815; H01L 2224/16145; H01L 2224/16225; H01L 2224/13147; H01L 2224/13155; H01L 2224/13111; H01L 2224/48227; H01L 2224/73253; H01L 2224/29301; H01L 2224/2929

See application file for complete search history.

(56) References Cited

U.S. PATENT DOCUMENTS 6,046,077 A * 4/2000 Baba ............... H01L 21/563
257/E21.503
6,284,569 B1 * 9/2001 Sheppard ............ H01L 21/56
257/E21.502

(Continued)

*Primary Examiner* — Dale E Page
*Assistant Examiner* — Quovaunda Jefferson
(74) *Attorney, Agent, or Firm* — Perkins Coie LLP

(57) ABSTRACT

Several embodiments of the present technology are described with reference to a semiconductor die assembly and processes for manufacturing the assembly. In some embodiments of the present technology, a semiconductor die assembly includes a stack of semiconductor dies attached to a thermal transfer structure (also known as a "heat spreader," "lid," or "thermal lid"). The thermal transfer structure conducts heat away from the stack of semiconductor dies. Additionally, the assembly can include molded walls fabricated with molding material to support the thermal transfer structure.

12 Claims, 8 Drawing Sheets

(51) Int. Cl.
*H01L 23/31* (2006.01)
*H01L 23/053* (2006.01)
*H01L 21/56* (2006.01)
*H01L 21/48* (2006.01)
*H01L 23/10* (2006.01)
*H01L 23/24* (2006.01)
*H01L 23/433* (2006.01)
*H01L 23/08* (2006.01)
*H01L 23/373* (2006.01)
*H01L 25/18* (2006.01)
*H01L 23/00* (2006.01)

(52) U.S. Cl.
CPC .......... *H01L 21/563* (2013.01); *H01L 21/565* (2013.01); *H01L 23/053* (2013.01); *H01L 23/08* (2013.01); *H01L 23/10* (2013.01); *H01L 23/24* (2013.01); *H01L 23/3142* (2013.01); *H01L 23/367* (2013.01); *H01L 23/3675* (2013.01); *H01L 23/4334* (2013.01); *H01L 23/3736* (2013.01); *H01L 24/13* (2013.01); *H01L 24/16* (2013.01); *H01L 24/29* (2013.01); *H01L 24/48* (2013.01); *H01L 24/73* (2013.01); *H01L 24/81* (2013.01); *H01L 25/18* (2013.01); *H01L 2224/1329* (2013.01); *H01L 2224/13111* (2013.01); *H01L 2224/13147* (2013.01); *H01L 2224/13155* (2013.01); *H01L 2224/16145* (2013.01); *H01L 2224/16225* (2013.01); *H01L 2224/16227* (2013.01); *H01L 2224/2929* (2013.01); *H01L 2224/29301* (2013.01); *H01L 2224/29393* (2013.01); *H01L 2224/48227* (2013.01); *H01L 2224/73253* (2013.01); *H01L 2224/81815* (2013.01); *H01L 2225/06513* (2013.01); *H01L 2225/06517* (2013.01); *H01L 2225/06555* (2013.01); *H01L 2225/06589* (2013.01); *H01L 2924/1436* (2013.01); *H01L 2924/1437* (2013.01); *H01L 2924/1616* (2013.01); *H01L 2924/16195* (2013.01); *H01L 2924/16235* (2013.01); *H01L 2924/16251* (2013.01); *H01L 2924/173* (2013.01); *H01L 2924/1715* (2013.01); *H01L 2924/19041* (2013.01); *H01L 2924/19105* (2013.01)

(56) References Cited

U.S. PATENT DOCUMENTS

| | | | | |
|---|---|---|---|---|
| 6,376,904 | B1* | 4/2002 | Haba | H01L 23/3128 174/541 |
| 7,638,362 | B2* | 12/2009 | Ishino | H01L 25/0657 438/107 |
| 2001/0043130 | A1* | 11/2001 | Nagamori | H01P 5/185 333/116 |
| 2006/0223232 | A1* | 10/2006 | Egawa | H01L 21/563 438/109 |
| 2007/0132070 | A1* | 6/2007 | V. Buot | H01L 25/16 257/662 |
| 2007/0152326 | A1* | 7/2007 | Lim | H01L 23/16 257/723 |
| 2010/0258932 | A1* | 10/2010 | Yoshida | H01L 21/561 257/686 |
| 2014/0134804 | A1* | 5/2014 | Kelly | H01L 23/147 438/118 |

* cited by examiner

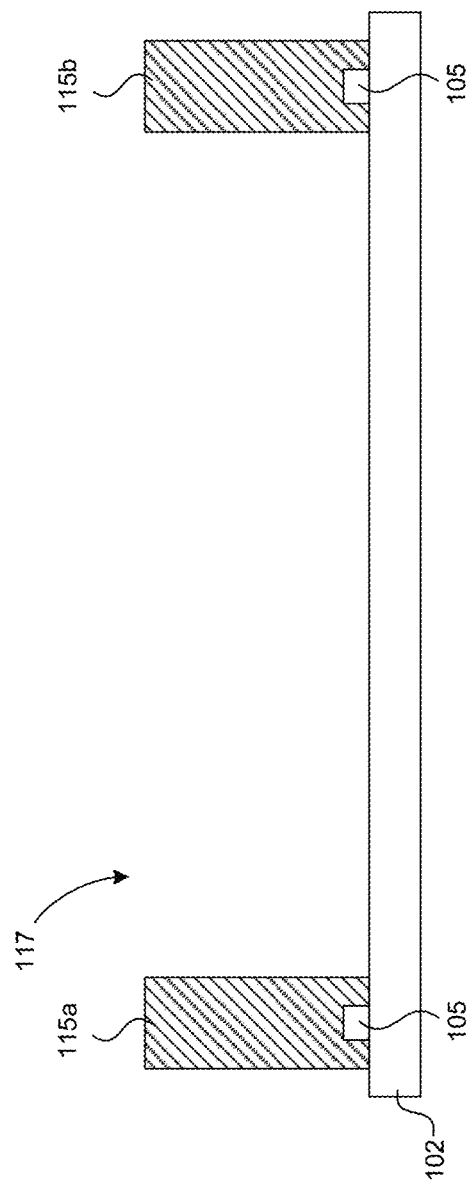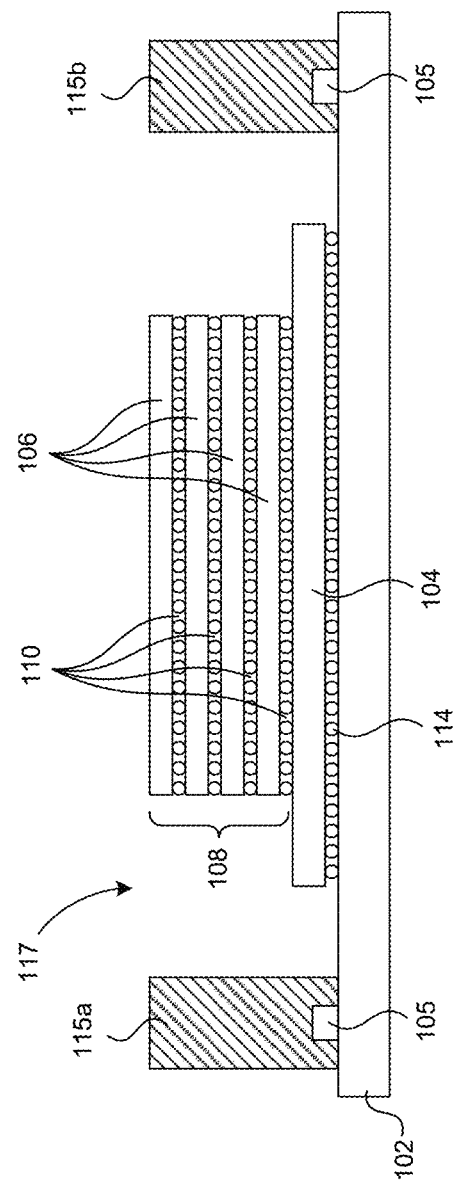

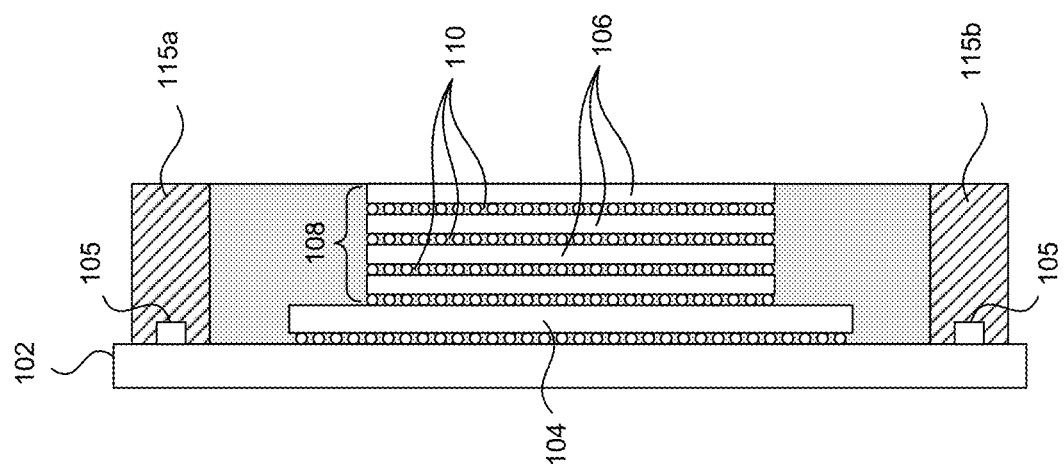
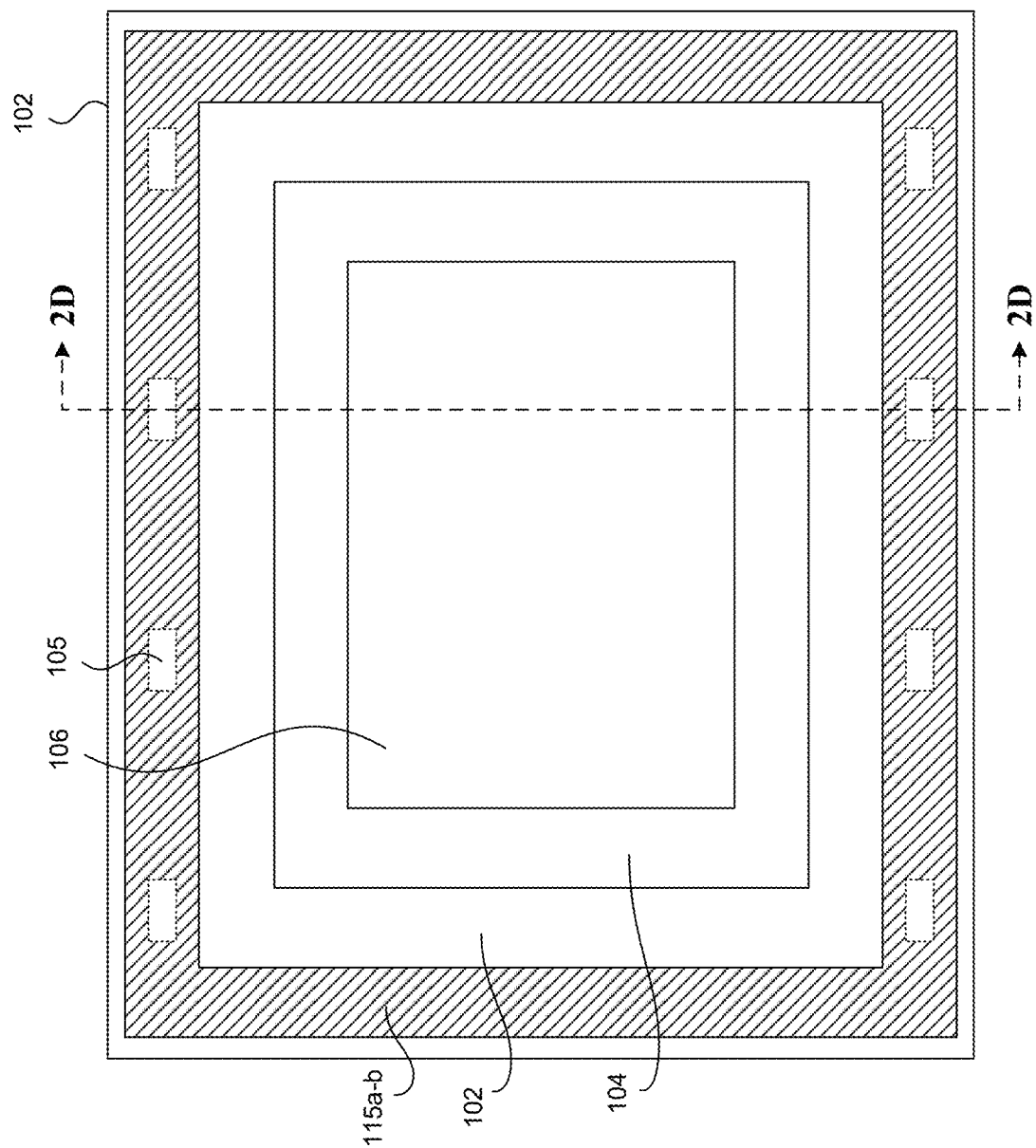
FIG. 2D
FIG. 2C

THERMAL TRANSFER STRUCTURES FOR SEMICONDUCTOR DIE ASSEMBLIES

TECHNICAL FIELD

The present technology relates to a semiconductor die assembly. In particular, the present technology relates to a semiconductor die assembly with stacked dies and a thermal transfer structure to conduct heat away from the stacked dies. Additionally, the semiconductor die assembly can include molded walls to support the thermal transfer structure.

BACKGROUND

Packaged semiconductor dies, including memory chips, microprocessor chips, and imager chips, typically include a semiconductor die mounted on a substrate and encased in a plastic protective covering. The semiconductor die includes functional features, such as memory cells, processor circuits, and imager devices, as well as bond pads electrically connected to the functional features. The bond pads are electrically connected to terminals outside the protective covering to connect to higher-level circuitry.

Market pressures continually drive semiconductor manufacturers to reduce the size of die packages to fit within the space constraints of electronic devices, while also driving them to increase the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. The dies in such vertically stacked packages are interconnected by electrically coupling the bond pads of the individual dies with the bond pads of adjacent dies using through-silicon vias (TSVs).

A challenge associated with vertically stacked die packages is that the heat generated by the individual dies is additive, and it is difficult to dissipate the aggregated heat generated by the stacked dies. This additive heat increases the operating temperatures of the individual dies, the junctions between the dies, and the package as a whole, which cause the stacked dies to reach temperatures above their maximum operating temperatures ($T_{max}$). This problem is exacerbated as the density of the dies in the package increases. Moreover, when devices have different types of dies in the die stack, the maximum operating temperature of the device is limited to the die with the lowest maximum operating temperature.

BRIEF DESCRIPTION OF THE DRAWINGS

Many aspects of the present technology can be better understood with reference to the following drawings. The components in the drawings are not necessarily to scale and instead primarily illustrate the principles of the present technology.

FIGS. 2A-2B illustrate aspects of a method of manufacturing the semiconductor die assembly in FIG. 1 in accordance with embodiments of the present technology.

FIG. 2C is a top view of the semiconductor die assembly as shown in FIG. 2B in accordance with embodiments of the present technology.

FIG. 2D is a side cross-sectional view of aspects of the method of manufacturing the semiconductor die assembly in accordance with embodiments of the present technology.

DETAILED DESCRIPTION

Specific details of several embodiments of the present technology are described below with reference to a semiconductor die assembly and processes for manufacturing the assembly. In some embodiments, a semiconductor die assembly includes a stack of semiconductor dies attached to a thermal transfer structure (also known as a "heat spreader," "lid," or "thermal lid"). The thermal transfer structure ("TTS") conducts heat away from the stack of semiconductor dies. Additionally, the semiconductor die assembly includes molded walls composed of a molded material (e.g., epoxy, phenol formaldehyde resin, etc.). The molded walls support the thermal transfer structure as well as provide a dam for underfill material in the semiconductor die assembly.

Used herein, the term "semiconductor die" generally refers to a die having integrated circuits or components, data storage elements, processing components, and/or other features manufactured on semiconductor substrates. For example, semiconductor dies can include integrated circuit memory and/or logic circuitry. Semiconductor dies and/or other features in semiconductor die packages can be said to be in "thermal contact" with one another if the two structures can exchange energy through heat via, for example, conduction, convection, and/or radiation. A person skilled in the relevant art will also understand that the technology may have additional embodiments, and that the technology may be practiced without several of the details of the embodiments described below with reference to FIGS. 1-6.

As used herein, the terms "vertical," "lateral," "upper," and "lower" can refer to relative directions or positions of features in the semiconductor die assemblies in view of the orientation shown in the figures. For example, "upper" or "uppermost" can refer to a feature positioned closer to the top of a page than another feature. These terms, however, should be construed broadly to include semiconductor dies having other orientations, such as inverted or inclined orientations where top/bottom, over/under, above/below, up/down, and left/right can be interchanged depending on the orientation.

Various Embodiments of a Semiconductor Die Assembly

Figure 1:
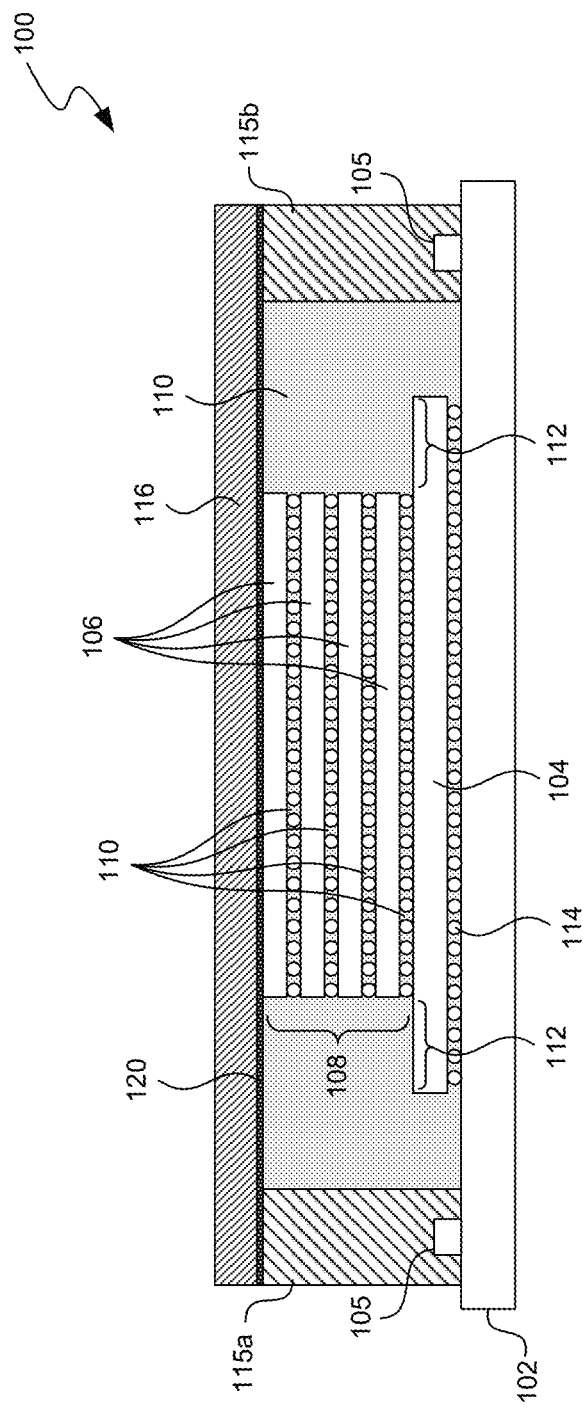
FIG. 1 is a cross-sectional view of a semiconductor die assembly configured in accordance with embodiments of the present technology.

FIG. 1 is a cross-sectional view illustrating a semiconductor die assembly 100 ("assembly 100") in accordance with embodiments of the present technology. The assembly 100 includes a support substrate 102, a first semiconductor die 104 ("first die 104") mounted to the support substrate 102, a plurality of second semiconductor dies 106 ("second die(s) 106") arranged in a stack 108 mounted on the first die 104, and a plurality of capacitors 105 mounted to the substrate 102. The assembly 100 has an underfill material 110 positioned between the second dies 106, and between the first die 104 and bottom second die 106.

The assembly 100 also has molded walls 115a-b around at least a portion of the stack 108 and a thermal transfer structure ("TTS") 116. The molded walls 115a-b define a molded support structure that supports the TTS 116 and a dam that inhibits the movement of underfill material 110. The molded walls 115a-b (e.g., epoxy or resin) are inexpensive compared to metal, and can be fabricated with precision to a height nearly equal to the height of the stack 108. The TTS 116 conducts heat away from assembly 100 and covers components of the assembly 100.

As shown in FIG. 1, the support substrate 102 can be an interposer or printed circuit board that includes semiconductor components (e.g., doped silicon wafers or gallium arsenide wafers), nonconductive components (e.g., various ceramic substrates, such as aluminum oxide ($Al_2O_3$), etc.), aluminum nitride, and/or conductive portions (e.g., interconnecting circuitry, TSVs, etc.). Also, support substrate 102 can be operatively coupled to the first die 104 with solder balls 114. In addition to or in alternative to solder balls, the first die 104 can be operatively coupled to the stack 108 with electrical connectors such as wires, vias, through-silicon vias (TSVs), conductive bumps and pillars, conductive epoxies, and/or other suitable electrically conductive elements (not shown in FIG. 1).

The stack 108 shown in FIG. 1 includes four second dies 106 electrically coupled together with electrically conductive elements such as solder balls 114. In some embodiments, the electrically conductive elements can have various suitable structures, such as pillars, columns, studs, bumps, etc., and can be made from copper, nickel, solder (e.g., SnAg-based solder), conductor-filled epoxy, and/or other electrically conductive materials. For example, the electrically conductive elements can be copper pillars or bump-on-nitride structures. In other embodiments, the stack 108 can include more or fewer than four second dies (e.g., two, six, eight, or more dies) with electrically conductive elements between and/or connecting the second dies. The second die 106 located the farthest away from substrate 102 can be referred to as "the top second die" 106, and the second die 106 located closest to the substrate 102 can be referred to as "the bottom second die" 106.

The assembly 100 can further include a plurality of capacitors 105 operatively coupled to the first die 104 and second dies 106 to stabilize the electronic signals passing through or coming from the second dies 106, the first die 104, and/or a processor (not shown in FIG. 1) connected to the assembly 100. Also, the plurality of capacitors 105 improve signal integrity because they increase capacitance for the assembly 100. The assembly 100 can also include other electrical elements, such as diodes and/or inductors, that are operatively coupled to the support substrate 102, the first die 104, and the stack 108.

The first die 104 and the second dies 106 can include various types of semiconductor components and functional features, such as dynamic random-access memory (DRAM), static random-access memory (SRAM), flash memory, other forms of integrated circuit memory, processing circuits, imaging components, and/or other semiconductor features. In various embodiments, for example, the assembly 100 is a hybrid memory cube (HMC) in which the stacked second dies 106 are DRAM dies or other memory dies that provide data storage and the first die 104 is a high-speed logic die that provides memory control (e.g., DRAM control) within the HMC.

In addition, the assembly 100 includes underfill material 110 between each of the second dies 106. The underfill material 110 is typically a flowable material that fills the interstitial spaces between the second dies 106. The underfill material 110 can be a nonconductive epoxy paste (e.g., XS8448-171 manufactured by Namics Corporation of Niigata, Japan), a capillary underfill, a nonconductive film, and/or it can include other suitable electrically insulative materials. The underfill material 110 can alternatively be a dielectric underfill, such as FP4585 manufactured by Henkel of Dusseldorf, Germany. In some embodiments, the underfill material 110 can be selected based on its thermal conductivity to enhance heat dissipation through the stack 108. As shown in FIG. 1, underfill material 110 can be injected into the region between the molded walls 115a-b and the stack 108. The underfill material 110 typically flows into the gap between the first die 104 and the bottom second die 106 and the gaps between the second dies 106 in the stack 108. Although not shown in FIG. 1, the amount of underfill material 110 injected into the assembly 100 may be based on desired coverage of underfill material for the first die 104 and second dies 106. Because underfill material 110 is viscous, it can move (e.g., when heated up), and the molded walls 115a-b act as a dam to inhibit movement of underfill material 110.

The TTS 116 transfers heat away from the first die 104 and the stack 108. The TTS 116 is also known as "heat spreader," "lid," or "thermal lid". The TTS 116 can be composed of copper (Cu), nickel (Ni), another metal with relatively high thermal conductivity, and/or any combination thereof. In some embodiments, the composition (e.g., percentage Cu or Ni) of the TTS 116 is varied to decrease the cost of producing the TTS 116 or to increase (e.g., optimize) the thermal transfer coefficient of the TTS 116. For example, the TTS 116 can be composed of 55% copper and 45% nickel. Accordingly, the TTS 116 covers, encloses, and otherwise protects the stack 108. Also as shown in FIG. 1, the TTS 116 is relatively long and flat, increasing contact between the components of the assembly 100 and the providing a large thermally conductive surface area to better dissipate heat from the assembly 100.

The TTS 116 is attached to the molded wall 115a-b by an adhesive 120. The molded walls 115a-b can be composed of epoxy, phenol formaldehyde resin, or another moldable compound with relatively good heat transfer properties. In general, the molded walls 115a-b support the TTS 116 and function as a dam for the underfill material 110. In some embodiments, a high-conductivity mold material can also be used to fabricate molded walls to enhance heat dissipation from the first die 104 and the stack 108. Additionally, the molded walls 115a-b can also include phenolic hardeners, silicas, pigments, and catalysts to accelerate cure reactions when fabricating the molded walls 115a-b. Also as shown in FIG. 1, the molded walls 115a-b have a recessed surface to enclose the plurality of capacitors 105. In general, the molded walls 115a-b are composed of a non-metal to reduce cost and enable molding of the walls 115a-b around the first and second dies 104 and 106 and over the capacitors 105.

There are several expected advantages to the molded walls 115a-b compared to an all-metal enclosure. The molded walls 115a-b can reduce the cost of manufacturing the assembly 100 because mold material is less expensive than metal. Additionally, it is easier to fabricate the molded walls 115a-b to encapsulate the plurality of capacitors 105 as compared to etching and/or shaping metal to cover the capacitors. Also, adding molding around the capacitors increases the thickness of the molded walls 115a-b, which provides additional structural support to the TTS 116. Additionally, the molded walls 115a-b enable higher stacks (e.g., more dies) because the dam effect enables underfill material to easily cover upper dies in large stacks (e.g., four or more dies). Overall, molded walls have tight dimensional tolerances, good reliability, and high yield. Other advantages will become apparent to those having ordinary skill in the art based on this disclosure. Also, all of the advantages of the present technology may not be included in all embodiments described below.

To attach the TTS 116 to the assembly 100, the adhesive 120 is applied. Adhesive 120 can be a thermal interface material ("TIM") or another adhesive including a silicone-based grease, gel, or adhesive that is doped with conductive materials (e.g., carbon nanotubes, solder materials, diamond-like carbon, etc.). In some implementations, the adhesive 120 can include phase-change materials.

As shown in FIG. 1, the first die 104 includes peripheral regions 112 (also referred to as the "porch" or "shelf") that extend laterally outboard of the other dies in stack 108. The peripheral regions 112 are defined by the relative dimensions of the first die 104 and the position of the stack 108. In the embodiment illustrated in FIG. 1, the stack 108 is centered with respect to the length of the first die 104 such that the peripheral regions 112 extend laterally beyond two opposing sides of the stack 108. For example, if the length of the first die 104 is approximately 1.0 mm greater than the length of the second dies 106, the peripheral regions 112 will extend about 0.5 mm beyond either side of the centered second dies 106. In other embodiments, the stack 108 may be offset with respect to the center of the support substrate 102. In further embodiments, the first die 104 and the second dies 106 can be circular, and therefore the relative diameters of the first and second dies 104 and 106 define the peripheral regions 112.

Also, the first die 104 and second dies 106 can be rectangular, circular, and/or other suitable shapes and may have various different dimensions. The first die 104 can have a length of about 12-13 mm (e.g., 12.67 mm) and a width of about 8-9 mm (e.g., 8.5 mm, 8.6 mm, etc.). For example, the individual second dies 106 can each have a length of about 10-11 mm (e.g., 10.7 mm) and a width of about 8-9 mm (e.g., 8.6 mm, 8.7 mm). In other embodiments, the first and second dies can have other suitable dimensions and/or the individual second dies 106 may have different dimensions from one another. Although not shown in FIG. 1, the first die 104 and second dies 106 may be the same size, resulting in no peripheral region 112, or the second dies 106 may be shifted to change the size of the peripheral regions 112.

Method of Manufacturing a Semiconductor Die Assembly

FIGS. 2A-2B illustrate aspects of a method of manufacturing the assembly 100 as shown in FIG. 1. In FIG. 2A, the plurality of capacitors 105 are electrically coupled to the support substrate 102. The plurality of capacitors 105 can undergo a reflow process to be electronically coupled to the substrate 102. After the plurality of capacitors 105 are electronically coupled to the substrate 102, the molded walls 115a-b are formed on the substrate 102 to encapsulate the plurality of capacitors 105 and form a cavity 117. In some embodiments, an encapsulation or packaging tool is used to attach the molded walls 115a-b to the plurality of capacitors 105 and the substrate 102. Alternatively, a molding machine can be used to fabricate molded walls 115a-b directly on the substrate 102. Overall, the height of the molded walls 115a-b can be determined with precision and at a low cost because mold material is generally easy to shape and is less expensive than other materials such as metal.

As shown in FIG. 2B, after the molded walls 115a-b are attached, the first die 104 is attached to the substrate 112 by solder balls 114 and the second dies 106 are then stacked over the first die 104. The dies 104 and 106 are placed in the cavity 117 formed by the molded walls 115a-b.

FIG. 2C is a top view of the semiconductor die assembly shown in FIG. 2B. As shown from the top view, the molded walls 115a-b provide support in a rectangular shape that extends around the complete perimeter of the stack 108. In other embodiments, the molded walls 115a-b extend around only a portion of the perimeter of the stack 108. In some embodiments, molded walls 115a-b are relatively thick because the plurality of capacitors 105 are encapsulated in the molded walls 115a-b. Thick molded walls 115a-b enable increased contact with the TTS 116, which in turn increases structural support.

FIG. 2D is a side cross-sectional view showing the assembly after the underfill material 110 has been injecting into the cavity 117 (FIG. 2C) between the molded wall 115a-b and the first and second dies 104 and 106. In this embodiment, the underfill material 110 covers the peripheral region 112 (FIG. 1) of the first die 104 and fills the space between the molded walls 115a-b and the first and second dies 104 and 106. The underfill material 110 also flows between the dies 104 and 106 via capillary action to fill the gaps between the dies. As described above, the molded wall 115a-b provide a dam that restricts the lateral flow of the underfill material 110. In the embodiment shown in FIG. 2D, the top surface of the underfill material 110 can be co-planar with the top surface of the top second die 106, but in other embodiments the top surface of the underfill material 110 can have a different height either above or below the top surface of the top second die 106.

After injecting the underfill material 110 into the cavity 117, the TTS 116 (FIG. 1) can be attached to form the assembly 100 shown in FIG. 1. The TTS 116 can be attached to the top surface of the molded walls 115a-b, the top surface of the top second die 106 and the top surface of the underfill material 110 by an adhesive. In some embodiments, the assembly can be heated (e.g., baked) to strengthen the adhesion of the adhesive 120 to the molded walls 115a-b and to the top surface of the second dies 106. The adhesive can be a thermal interface material having high thermal conductivity.

Additional Various Embodiments of a Semiconductor Die Assembly

Figure 3:
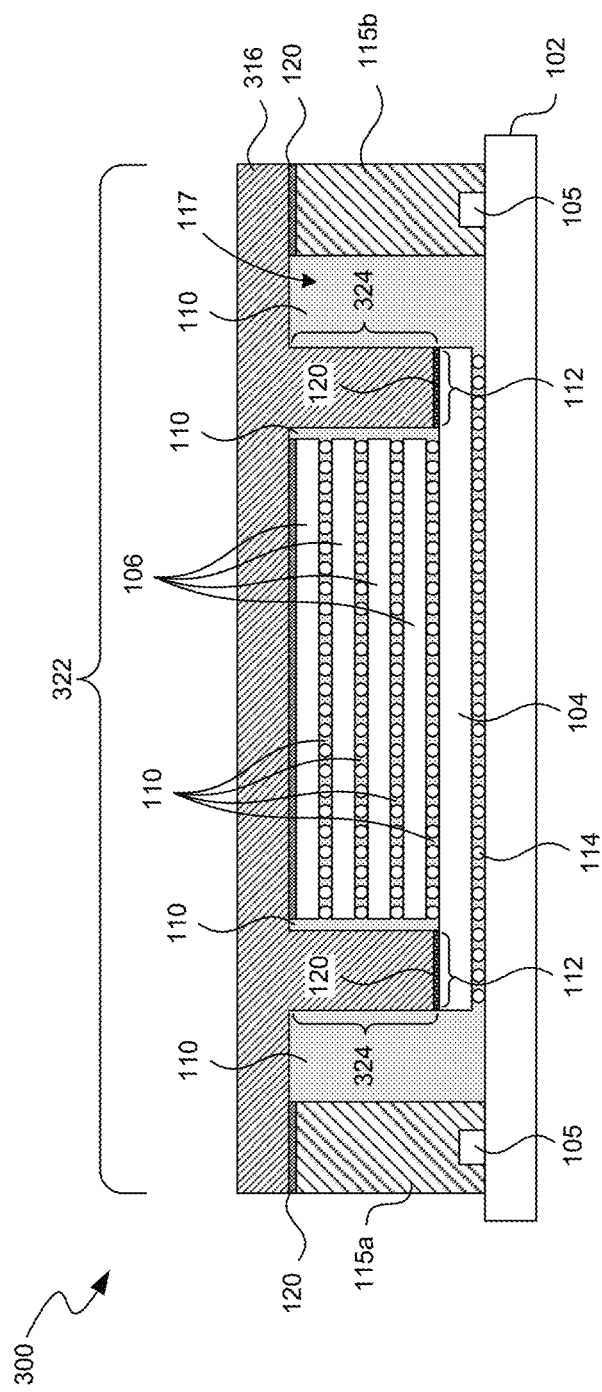
FIG. 3 is a cross-sectional view of a semiconductor die assembly configured in accordance with embodiments of the present technology.

FIG. 3 is a cross-sectional view of a semiconductor die assembly ("assembly 300") configured in accordance with embodiments of the present technology. The assembly 300 has generally the same components as the assembly 100 of FIG. 1 except the assembly 300 includes a thermal transfer structure (TTS) 316 with a different configuration compared to the TTS 116 of FIG. 1. The embodiment of the TTS 316 shown in FIG. 3 has a first portion 322 and a second portion 324. The first portion 322 extends in a first direction (e.g., horizontally as shown in FIG. 1) at least generally parallel to the first die 104 and the support substrate 102. The second portion 324 can be defined by two panels that extend from the first portion 322 in a second direction (e.g., vertically as shown in FIG. 1) toward the first die 104 and the support substrate 102. The TTS 316 can be made from a material having a high thermal conductivity, such as copper, aluminum, other metals, or silicon. The bottom surface of the second portion 324 is attached to the peripheral region 112 of the first die 104 by an adhesive 120, such as a TIM, to provide good thermal conduction from the first die 104 to the second portion 324 of the TTS 316.

As shown in FIG. 3, the TTS 316 conducts a relatively high amount of heat away from the first die 104. For example, the first die 104 can be a logic die. Logic dies typically operate at a higher power level than memory dies (e.g., 5.24 W compared to 0.628 W, respectively). As a result of operating at a high power, the logic die configuration generally concentrates a significant amount of heat at the peripheral regions 112 of the first die 104. The logic die may also have a higher power density at the peripheral regions 112, resulting in further concentration of heat and higher temperatures at the peripheral regions 112. As such, by coupling a large percentage of the peripheral regions 112 of the first die 104 to the highly conductive (e.g., metal) second portion 324 of the TTS 316, the heat can be efficiently removed from the peripheral regions 112 of the first die 104 and from the stack 108.

Various Embodiments of a Thermal Transfer Structure (TTS)

Figure 4A:
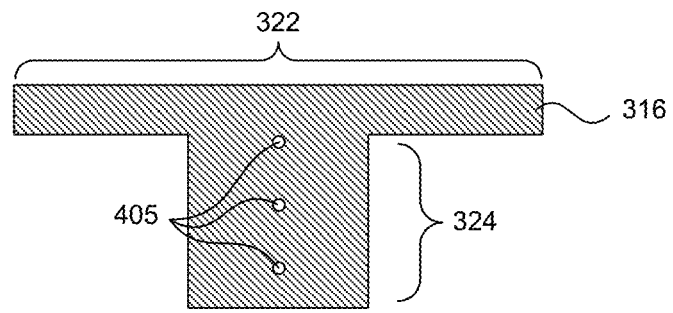
FIGS. 4A and 4B are cross-sectional views of a portion of the semiconductor die assembly as shown in FIG. 3 in accordance with embodiments of the present technology.

FIG. 4A is a cross-sectional view of an embodiment of the TTS 316 shown in FIG. 3 having a plurality of holes 405 through one of the panels of the second portion 324. As shown in FIG. 4A, the holes 405 (also referred to as "passages") can be drilled or stamped through second portion 324 of the TTS 316. The holes 405 provide a passage through which underfill material 110 can flow. For example, as underfill material 110 is injected into the cavity (FIG. 3), some of the underfill material 110 can flow through the holes 405 and into the space between the stack 108 and the second portion 324. The underfill material 110 within the second portion 324 can then fill the gaps between the dies.

Figure 4B:
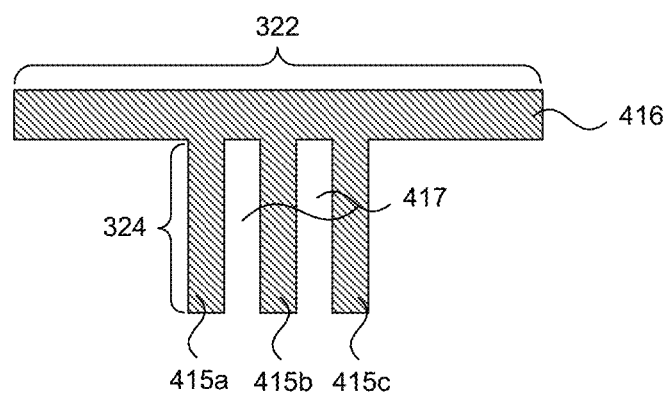

FIG. 4B shows an alternative embodiment of a TTS 416 that can have a similar composition to the TTS 316 shown in FIG. 4A, but a different configuration. In particular, the second portion 324 of the TTS 416 includes fins 415a, 415b, and 415c separated by passages 417. The fins 415a, 415b, and 415c can be formed by cutting or stamping the TTS 416 before it is positioned in an assembly. The passages 417 enable underfill material to flow through the second portion 324 and between the second dies 106 of the stack 108. The fins 415a, 415b, and 415c transfer heat from the peripheral region of the first die 104 and from the stack 108. The width and size of the fins 415a-c can be increased or decreased based on design specifications (e.g., cost of material, desired heat transfer properties such as increasing surface contact of the TTS with the stack 108).

Figure 5:
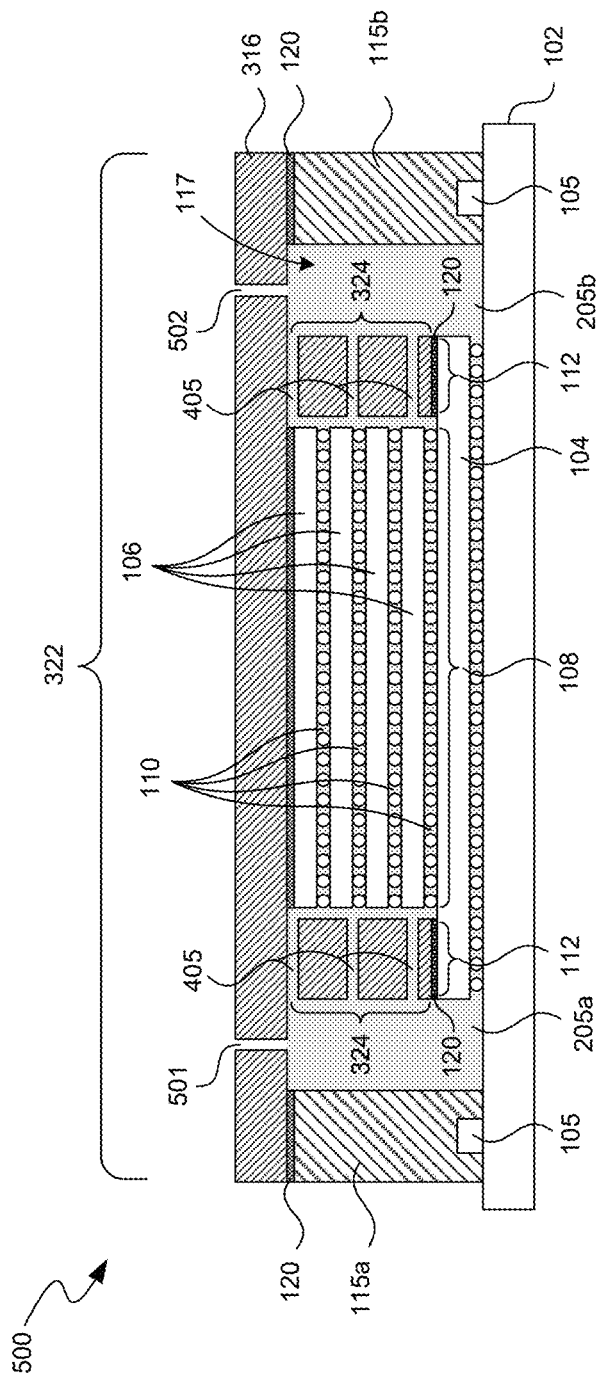
FIG. 5 is a cross-sectional view of a semiconductor die assembly configured in accordance with embodiments of the present technology.

FIG. 5 is a cross-sectional view of a semiconductor die assembly 500 having the TTS 316 (FIG. 4A) attached to the molded walls 115a-b, the first die 104 and the top second die 106. FIG. 5 further illustrates that the TTS 316 includes an inlet 501 and a vent 502 for filling the cavity 117 and the gaps between the dies with underfill material 110. The underfill material 110 is injected into the cavity 117 through inlet 501. As the underfill material 110 fills the cavity 117, a portion of the underfill material flows through holes 405 (e.g., passages) and into the space between the stack 108 of second semiconductor dies 106 and the second portion 324 of the TTS 316. The underfill material further fills the gap between the first die 104 and the bottom second die 106 as well as the gaps between the second semiconductor dies 106. As the underfill materials the cavity 117, air is displaced through the vent 502. Although not shown in FIG. 5, the TTS 416 (FIG. 4B) can also have an inlet and an outlet to inject the underfill material 110 into the cavity 117 and between the dies.

Figure 6:
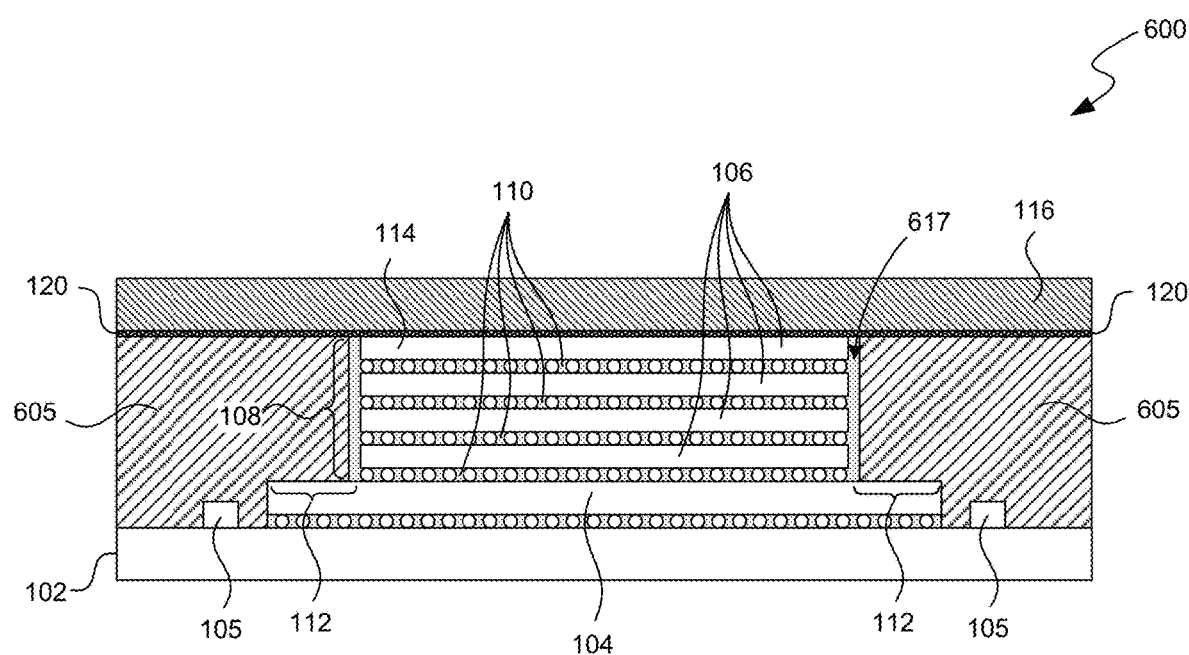
FIG. 6 is a cross-sectional view of a semiconductor die assembly configured in accordance with embodiments of the present technology.

FIG. 6 is a cross-sectional view of a semiconductor die assembly configured in accordance with embodiments of the present technology. Similar to assembly 100 in FIG. 1, the assembly 600 in FIG. 6 includes a support substrate 102, a first die 104 mounted to the support substrate 102, a plurality of second dies 106 arranged in a stack 108, underfill material 110 between the dies, and a plurality of capacitors 105. In contrast to the assembly 100 in FIG. 1, the assembly 600 includes a molded wall 605 that covers the capacitors 105 and the peripheral region 112 of the first die. The molded wall 605 defines a cavity 617 that is smaller than the first die 104 and configured to receive the stack 108 of second dies 106 such that a small gap exists between the molded wall 605 and the sides of the stack 108 of second dies 106. The molded wall 605 may be comprised of epoxy, phenol formaldehyde resin, or another moldable compound with relatively good heat transfer properties. When the molded wall is made from a dielectric material having a high thermal conductivity, one expected advantage of the molded wall 605 is that it provides an inexpensive was to dissipate heat away from the first die 104 and the stack 108. The cavity 617 and spaces between the second dies 106 is filled with the underfill material 110, and the TTS 116 can be attached to the molded wall 605 and the top second die 106 with an adhesive 120, such as a TIM.

Figure 7:
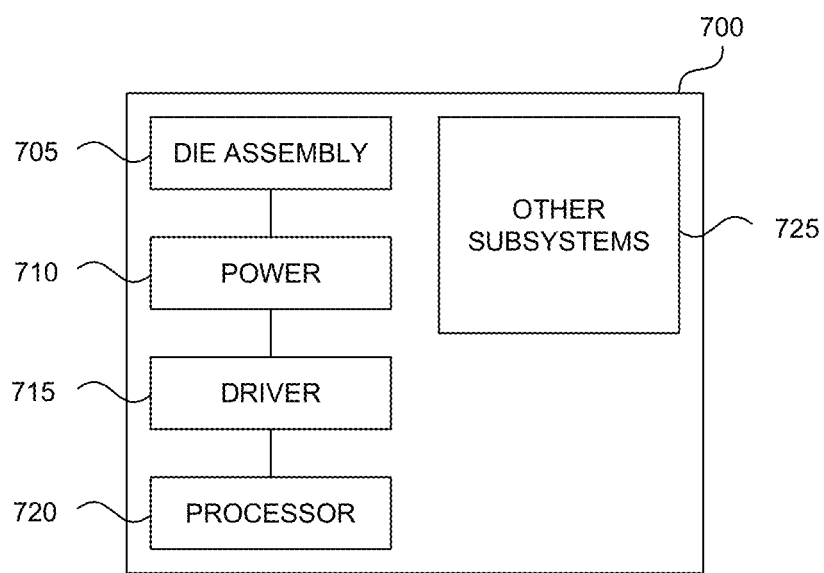
FIG. 7 is a schematic view of a system that includes a semiconductor die assembly configured in accordance with embodiments of the present technology.

Any one of the stacked semiconductor die assemblies described above with reference to FIGS. 1-6 can be incorporated into any of a myriad of larger and/or more complex systems, a representative example of which is system 700 shown schematically in FIG. 7. The system 700 can include a semiconductor die assembly 705, a power source 710, a driver 715, a processor 720, and/or other subsystems or components 725. The semiconductor die assembly 705 can include features generally similar to those of the stacked semiconductor die assemblies described above. The resulting system 700 can perform any of a wide variety of functions, such as memory storage, data processing, and/or other suitable functions. Accordingly, representative systems 700 can include, without limitation, hand-held devices (e.g., mobile phones, tablets, digital readers, and digital audio players), computers, vehicles, and appliances. Components of the system 700 may be housed in a single unit or distributed over multiple, interconnected units (e.g., through a communications network). The components of the system 700 can also include remote devices and any of a wide variety of computer readable media.

CONCLUSION

From the foregoing, it will be appreciated that specific embodiments of the technology have been described herein for purposes of illustration, but that various modifications may be made without deviating from the disclosure. For example, although many of the embodiments of the semiconductor die assemblies are described with respect to HMCs, in other embodiments the semiconductor die assemblies can be configured as other memory devices or other types of stacked die assemblies. In addition, the semiconductor die assemblies illustrated in FIGS. 1-6 include a plurality of first semiconductor dies arranged in a stack on the second semiconductor die. In other embodiments, however, the semiconductor die assemblies can include one first semiconductor die stacked on one or more of the second semiconductor dies.

Certain aspects of the new technology described in the context of particular embodiments may also be combined or eliminated in other embodiments. Moreover, although advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

I claim:

1. A semiconductor die assembly, comprising:
a support substrate;
a first semiconductor die on the support substrate;
a plurality of second semiconductor dies arranged in a stack on the first semiconductor die;
a molded wall made from a molded material, wherein the molded wall has parallel vertical surfaces on opposing sides of the stack of second semiconductor dies which at least partially define a cavity spaced apart from the stack of second semiconductor dies, and wherein (1) a portion of the molded wall is on the support substrate spaced laterally apart from the first semiconductor die and (2) the molded wall extends upward from the support substrate; and
a thermal transfer structure (TTS) over and directly attached to a top portion of the molded wall, wherein the TTS at least partially defines an upper boundary for the cavity and is configured to dissipate heat away from the first semiconductor die and the plurality of second semiconductor dies, wherein
the TTS further comprises a first portion extending in a first direction and a second portion extending in a second direction,
the first and second directions are different, and
the second portion is directly coupled to the first semiconductor die via an adhesive.

2. The semiconductor die assembly of claim 1, further comprising a plurality of capacitors on the support substrate, wherein the plurality of capacitors are operatively coupled to the stack, and wherein the molded wall has a recessed surface molded around the capacitor.

3. The semiconductor die assembly of claim 1 wherein the TTS comprises at least one of copper, nickel, or both.

4. The semiconductor die assembly of claim 1, further comprising an underfill material disposed between the molded wall and the stack and between the plurality of second semiconductor dies arranged in the stack.

5. The semiconductor die assembly of claim 1 wherein the first semiconductor die is a logic die that extends at least partially beyond other semiconductor dies and is attached to the support substrate and operatively coupled to a capacitor.

6. A semiconductor die assembly, comprising:
a support substrate;
a first semiconductor die on the support substrate;
a stack of second semiconductor dies on the first semiconductor die, wherein the second semiconductor dies have different functionality than the first semiconductor die;
a molded material formed on the substrate and having parallel vertical surfaces on opposing sides of the stack of second semiconductor dies which at least partially define a cavity, wherein (1) the stack of second semiconductor dies is received in the cavity and spaced apart from the molded material and (2) the molded material extends upward from the support substrate;
a thermal transfer lid having a first portion over and directly attached to a top portion of the molded material and a second portion extending from the first portion, wherein
the second portion of the thermal transfer lid is attached to the first semiconductor die and the thermal transfer lid at least partially defines an upper boundary for the cavity,
the second portion of the thermal transfer lid is attached to a peripheral region of the first die located on the bottom of the stack, and
the peripheral region extends beyond the second semiconductor dies in the stack.

7. The semiconductor die assembly of claim 6 wherein the molded wall covers an electronic component operatively coupled to the first semiconductor die in the stack.

8. The semiconductor die assembly of claim 6 wherein the molded wall further comprises at least one of an organic resin, nonorganic resin, epoxy, or a combination thereof.

9. The semiconductor die assembly of claim 6 wherein the thermal transfer lid comprises at least one of copper, nickel, or a combination thereof.

10. The semiconductor die assembly of claim 6 wherein the stack includes a logic die that extends at least partially beyond other semiconductor dies and is attached to the support substrate and operatively coupled to a capacitor, wherein the capacitor is operatively coupled to the support substrate.

11. The semiconductor die assembly of claim 6 wherein the thermal transfer lid has a plurality of passages.

12. The semiconductor die assembly of claim 6 wherein the stack comprises at least eight dies.

* * * * *